United States Patent
Mochizuki et al.

(10) Patent No.: US 9,177,937 B2
(45) Date of Patent: Nov. 3, 2015

(54) REACTION ABSORBER AND SEMICONDUCTOR ASSEMBLING SYSTEM

(75) Inventors: Masayuki Mochizuki, Kumagaya (JP); Yasushi Ishii, Kumagaya (JP)

(73) Assignee: FASFORD TECHNOLOGY CO., LTD., Yamanashi (JP)

( * ) Notice: Subject to any disclaimer, the term of this patent is extended or adjusted under 35 U.S.C. 154(b) by 566 days.

(21) Appl. No.: 12/880,399

(22) Filed: Sep. 13, 2010

(65) Prior Publication Data

US 2011/0259525 A1  Oct. 27, 2011

(30) Foreign Application Priority Data

Apr. 23, 2010  (JP) .................. 2010-100049

(51) Int. Cl.
*H01L 23/00* (2006.01)
*H01L 23/12* (2006.01)

(52) U.S. Cl.
CPC .............. *H01L 24/75* (2013.01); *H01L 24/83* (2013.01); *H01L 2224/83192* (2013.01); *H01L 2924/014* (2013.01); *H01L 2924/01005* (2013.01); *H01L 2924/01006* (2013.01); *H01L 2924/01033* (2013.01); *H01L 2924/01045* (2013.01); *H01L 2924/01082* (2013.01); *Y10T 29/5313* (2015.01)

(58) Field of Classification Search
CPC ............... H01L 24/75; H01L 24/83; H01L 2224/83192; H01L 2924/01033; H01L 2924/014; H01L 2924/01005; H01L 294/01006; H01L 2924/01045; H01L 2924/01082; Y10T 29/5313
USPC ........................................... 414/589
See application file for complete search history.

(56) References Cited

FOREIGN PATENT DOCUMENTS

| CN | 102235459 A | * | 11/2011 |
|---|---|---|---|
| EP | 1724054 A1 | * | 11/2006 |
| JP | 01-193134 | | 8/1989 |
| JP | 2000150581 A | * | 5/2000 |
| JP | 2000340606 A | * | 12/2000 |
| JP | 2000353720 A | * | 12/2000 |
| JP | 2002118142 A | * | 4/2002 |
| JP | 2003332359 A | * | 11/2003 |
| JP | 2004-263825 | | 9/2004 |
| JP | 2007317748 A | * | 12/2007 |
| JP | 2008066452 A | * | 3/2008 |
| JP | 2009093536 A | * | 4/2009 |

(Continued)

OTHER PUBLICATIONS

English translation of JP2004-263825; Sueda. Sep. 24, 2004.*

(Continued)

*Primary Examiner* — Sonya Mazumdar
(74) *Attorney, Agent, or Firm* — Mattingly & Malur, PC (57) ABSTRACT

The present invention aims to provide a lightened reaction absorber or to provide a semiconductor assembling system with further shorter processing time and high productivity or high quality using the lightened reaction absorber. The present invention is based upon a reaction absorber provided with a counter mechanism equipped with a load unit moved in a predetermined direction by a first ball screw, a second ball screw that generates reactive force in a reverse direction to the predetermined direction and a driving unit having a driving motor that drives the first ball screw and the second ball screw, and has a characteristic of including a reaction absorbing unit with one end side equipped with a nut connected to the second ball screw and the other end side fixed to a unit base movable relatively to the counter mechanism.

16 Claims, 5 Drawing Sheets

(56) References Cited

FOREIGN PATENT DOCUMENTS

| JP | 2010073113 A | * | 4/2010 |
| JP | 2011233578 A | * | 11/2011 |

OTHER PUBLICATIONS

English translation of JP 2002-118142; Mochizuki et al. Apr. 19, 2002.*

Translation of Office Action for CN201010279447.9; Chinese Patent Office; Feb. 16, 2013.*
English translation of EP1724054A1; Nov. 2006.*
English translation of JP 01-193134; Aug. 1999.*
English translation of JP2002198282; Jul. 2002.*
Chinese office action of dated Feb. 16, 2013.

* cited by examiner

REACTION ABSORBER AND SEMICONDUCTOR ASSEMBLING SYSTEM

FIELD OF THE INVENTION

The present invention relates to a semiconductor assembling system and a reaction absorber, and particularly relates to a semiconductor assembling system to which a lightened reaction absorber can be provided and having high productivity.

BACKGROUND OF THE INVENTION

As one semiconductor manufacturing system, there is a die bonder that bonds a semiconductor chip (a die) onto a board such as a lead frame. In the die bonder, a bonding head vacuum-suctions a die, raises it at high speed, horizontally moves it, lowers it and mounts it on the board.

Figure 7:
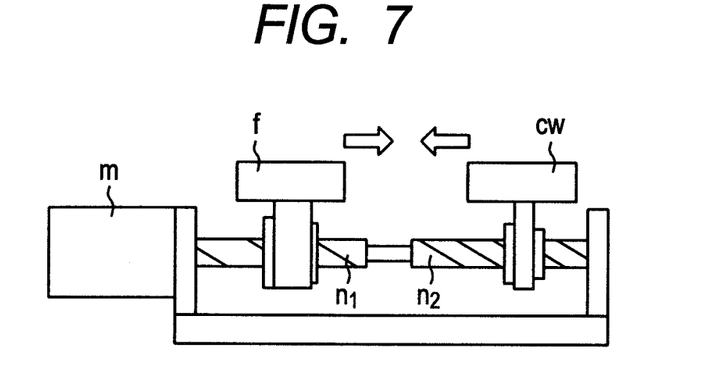
FIG. 7 shows a reaction absorber in the related art.

Generally, when a system is sped up, vibration by an object moving at high speed grows larger and precision at which the device aims cannot be acquired due to this vibration. For an example of the related art, JP-A-2004-263825 discloses a reaction absorber for reducing this vibration. In JP-A-2004-263825, as shown in FIG. 7, a method of adding a counterweight cw, driving two types of ball screws n1, n2 different in a lead by a motor m, moving a load f of a processing head (for example, a bonding head device) and the counterweight cw in reverse directions as shown by arrows and preventing vibration is adopted.

Generally, the mass of the counterweight and driving force have the relation of inverse proportion and in the related art, reverse momentum to driving is required to acquire the effect of damping. For example, when a load and the counterweight are equal in mass, as much energy for driving the counterweight as energy for driving the load is required and twice as much output of the driving motor is required. To reduce the energy for driving the counterweight, counter mass has only to be increased (when the counter mass is increased twice, the driving energy is reduced to a half); however, the weight of the reaction absorber is increased. In addition, the whole weight including the weight of the driving system that supplies the driving energy and the weight of the counter is also increased.

SUMMARY OF THE INVENTION

The present invention is made in view of the above-mentioned problem and a first object of the present invention is to provide a lightened reaction absorber.

Further, a second object of the present invention is to provide a semiconductor assembling system with further shorter processing time and high productivity or high quality using the lightened reaction absorber.

To achieve the first object of the present invention, a reaction absorber according to the present invention has a first characteristic that the reaction absorber is provided with a base, a support fixed to the base, a power source, a load unit that is moved by the power source, a counter mechanism that includes the power source and the load unit and relatively moves in relation to the load unit by the power source and a supporting member that is provided to the support and movably supports the counter mechanism.

The reaction absorber according to the present invention has a second characteristic that the load unit is moved via a first ball screw by the operation of the power source and the counter mechanism is movably supported via a second ball screw by the support.

The reaction absorber according to the present invention has a third characteristic that the reaction absorber is provided with a base, a support fixed to the base, a counter mechanism equipped with a first ball screw, a load unit moved in a predetermined direction by the first ball screw, a second ball screw that generates reactive force in a reverse direction to the predetermined direction and a driving unit equipped with a power source that drives the first ball screw and the second ball screw, a supporting member that is provided to the support and supports the counter mechanism movably by the second ball screw and a reaction absorbing unit that rotatably supports one end of the first ball screw and one end of the second ball screw and is fixed to the unit base which is movable relatively to the counter mechanism.

To achieve the object, the first ball screw and the second ball screw are aligned and are provided with a lead screw a thread of which is cut in the same direction.

Further, the unit base is fixed to prevent movement and the counter mechanism is moved along the unit base.

The power source directly or indirectly drives one end of one of the first ball screw and the second ball screw or respective one ends of the first ball screw and the second ball screw. In this case, "indirectly" means that the ball screw is connected to the power source via a gear mechanism or a belt mechanism. "Directly" means that the ball screw is directly connected to the power source without a gear mechanism or a belt mechanism.

The first ball screw and the second ball screw are arranged in parallel.

A lead of the first ball screw is larger than a lead of the second ball screw.

Further, to achieve the second object of the present invention, the semiconductor assembling system has a characteristic that the semiconductor assembling system is a die bonder and the reaction absorber is applied to at least one direct acting unit out of a bonding head, a preforming head and a wafer ring holder respectively with which the die bonder is provided in addition to the above-mentioned characteristics.

According to the present invention, the lightened reaction absorber can be provided.

Further, according to the present invention, the semiconductor assembling system with further shorter processing time and high productivity or high quality can be provided using the lightened reaction absorber.

DETAILED DESCRIPTION OF THE PREFERRED EMBODIMENTS

Referring to the drawings, an embodiment of the present invention will be described using a die bonder as a semiconductor assembling system for an example below.

Figure 3:
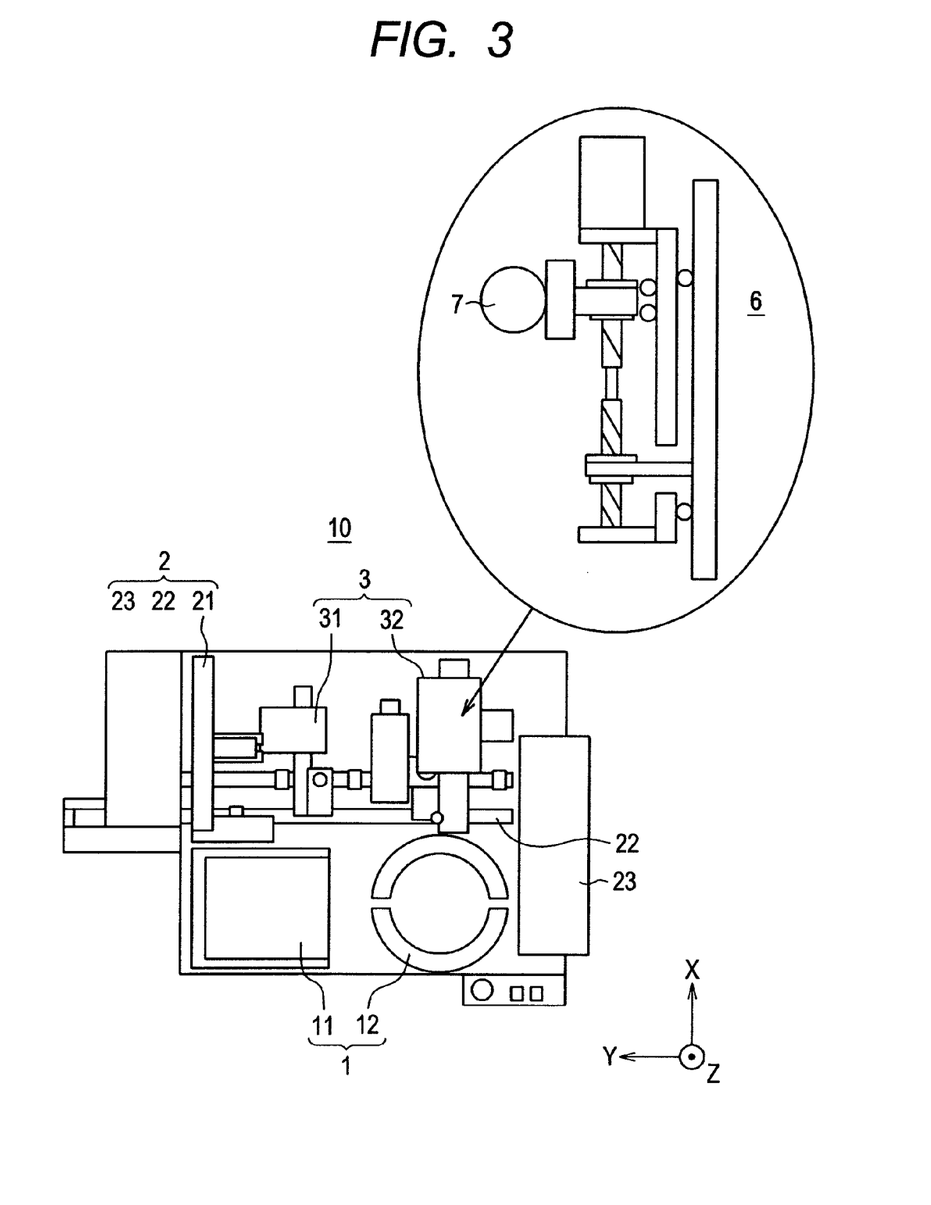
FIG. 3 is a schematic top view showing a die bonder equivalent to one embodiment of the present invention and a bonding head device.

FIG. 3 is a schematic top view showing the die bonder 10 equivalents to one embodiment of the present invention and also shows the details of a bonding head device 32. The die bonder is roughly provided with a wafer supply unit 1, a workpiece supplying/feeding unit 2 and a die bonding unit 3.

The wafer supply unit 1 is provided with a wafer cassette lifter 11 and a wafer ring holder 12. The wafer cassette lifter 11 is provided with a wafer cassette (not shown) filled with wafer rings and supplies a wafer ring to the wafer ring holder 12. The wafer ring holder 12 stretches a wafer tape that is held by the wafer ring downward to widen an interval between dies, helping the down side of a die be thrust up a die from the downside of the die by a thrusting unit, thus enhances the pickup performance of the die in a bonding process described later. Further, the wafer ring holder 12 is arranged on an X-Y direct acting table, directly moves to the next die position after pickup, to be ready for the next pickup.

The workpiece supplying/feeding unit 2 is provided with a stack loader 21, a frame feeder 22 and an unloader 23. A workpiece (a lead frame) supplied to the frame feeder 22 by the stack loader 21 is fed to the unloader 23 via two processing positions on the frame feeder 22.

The die bonding unit 3 is provided with a preformer 31 and the bonding head device 32. The preformer 31 applies a die adhesive to the workpiece fed by the frame feeder 22. The bonding head device 32 picks up the die from the wafer ring holder 12, raises it, moves it in horizontally, and moves it to the bonding point on the frame feeder 22. The bonding head device 32 lowers the die and bonds it onto the workpiece to which the die adhesive is applied.

The bonding head device 32 is provided with an X-direction reaction absorber 6 that moves a bonding head (see 32a in FIG. 4) between a pickup position in the wafer ring holder 12 and the bonding point, that is, in an X direction and a Z-direction reaction absorber 7 that is fixed to the X-direction reaction absorber 6 (that functions as a load) and moves the bonding head 32a vertically (in a Z direction).

Figure 1:
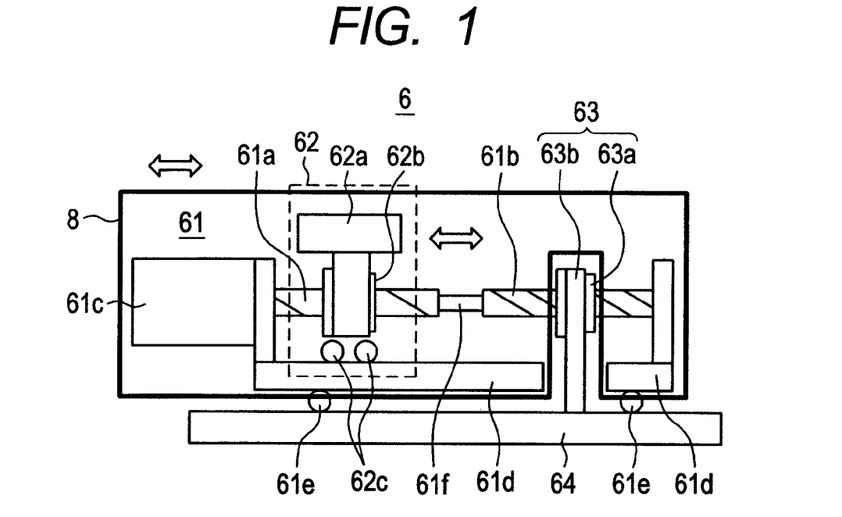
FIG. 1 shows the basic configuration of an X-direction reaction absorber equivalent to a first embodiment of the present invention.
Figure 2:
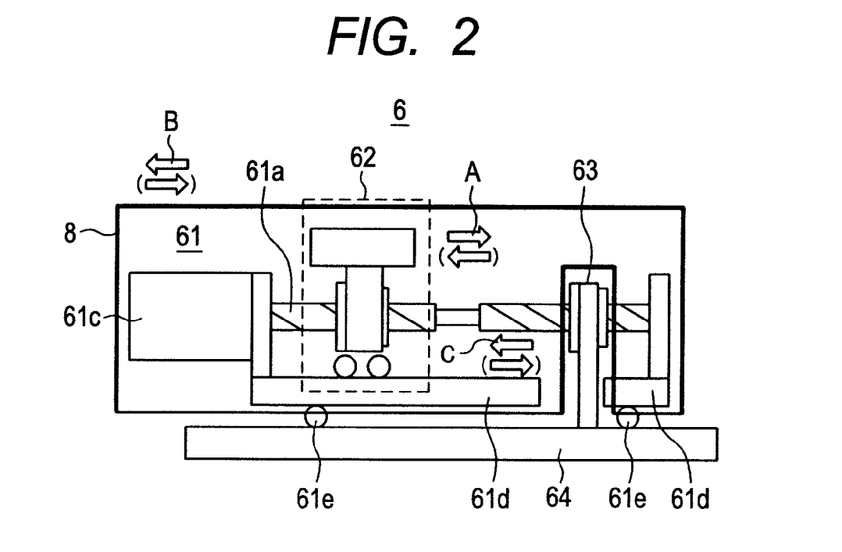
FIG. 2 shows an example of the operation of the X-direction reaction absorber shown in FIG. 1.

Referring to the drawings, embodiments of a reaction absorber that characterizes the present invention will be described below. FIG. 1 shows the basic configuration of the X-direction reaction absorber 6 equivalent to the first embodiment. FIG. 2 shows a state in which a load unit 62 that fixes the Z-direction reaction absorber 7 is moved rightward.

The X-direction reaction absorber 6 is roughly provided with the load unit 62 which is an object of movement and which is shown inside a broken line, a driving unit 61 that laterally moves the load unit as shown by arrows in FIG. 1, a reaction absorbing unit 63 that functions as a counter for reducing vibration by the load unit and a unit base 64 that supports or fixes these.

The driving unit 61 is provided with a ball screw 61a on the load side that moves the load unit 62, a ball screw 61b on the reaction absorption side coupled to the ball screw 61a on the load side via a coupler 61f for moving the reaction absorbing unit 63, a driving motor 61c (power source) that rotates both ball screws, a U-shaped driving fixed plate 61d that supports the driving motor and both ball screws and a base guide 61e that enables the driving fixed plate to move on the unit base 64.

The load unit 62 is provided with a load fixing base 62a that fixes or supports the reaction absorber 7 which is equipped with the bonding head 32a (see FIG. 4) at an end and which functions as a load, a load nut 62b fixed to the load fixing base and moved on the ball screw on the load side and a load guide 62c that makes the load unit 62 smoothly moved over the driving fixed plate 61d by the load nut. According to this configuration, the load unit 62 is laterally moved by the rotation of the ball screw 61a on the load side as shown by the arrows in FIG. 1.

Both threads of the ball screw 61b on the reaction absorption side and the ball screw 61a on the load side are cut in a forward (the same) direction. Further, the ratio M of a lead Rh of the ball screw 61b on the reaction absorption side to a lead Rd of the ball screw 61a on the load side has relation shown in an expression (1).

$$R = Rd/Rh : R > 1 \quad (1)$$

The reaction absorbing unit 63 is provided with a reaction absorption nut 63a (a supporting member) moved on the ball screw 61b on the reaction absorption side on the side of one end and reaction absorbent 63b (a support) fixed to the unit base 64 on the side of the other end.

The unit base 64 is fixed to the bonding head device 32 and fixes the reaction absorbing unit 63 as described above. Further, the unit base supports a counter mechanism 8 provided with the driving unit 61 and the load unit 62 respectively shown inside a thick line movably in directions shown by the arrows by the base guide 61e.

FIG. 2 shows an example of the operation of the reaction absorber 6 provided with the above-mentioned configuration. FIG. 2 shows the example that the load unit 62 is moved rightward as shown by an arrow A by sequentially rotating the ball screw 61a on the load side and the ball screw 61b on the reaction absorption side in the same direction. When the load unit is moved leftward, reverse operation is executed as shown in parentheses.

In a case shown in FIG. 2, the load unit 62 is moved rightward (leftward) by the rotation of the ball screw 61a on the load side and the ball screw 61b on the reaction absorption side and the reaction absorbing unit 63 also tries to move rightward (leftward). However, since the reaction absorbing unit 63 is fixed to the unit base 64, reactive force is conversely applied to the ball screw 61b on the reaction absorption side and the ball screw on the reaction absorption side is moved leftward as shown by an arrow C for the unit base 64. As a result, the counter mechanism 8 shown inside the thick line is moved over the unit base 64 by the base guide 61e leftward (rightward) as shown by an arrow B.

In this case, the load unit 62 also tries to move leftward (rightward) according to the movement of the driving unit 61. However, since the lead (the travel) of the ball screw 61a on the load side is larger as clear from the relation shown in the expression (1), the load unit 62 is moved rightward (leftward) as shown by the arrow A. A sufficient operational range can be acquired by setting the ratio R of the leads shown in the expression (1) to an appropriate value.

In this embodiment, as described above, the counter mechanism 8 shown inside the thick line in FIG. 2 and provided with the driving unit 61 and the load unit 62 functions as a counter load moved in a reverse direction to the load unit 62. That is, the mass Km of the counter mechanism 8 which accounts for the substantial whole of the reaction absorber functions as the counter load that absorbs the vibration. This is a characteristic of the first embodiment. When the ratio of the mass Km and the mass Fm of the load unit 62 shown inside the broken line is M (=Km/Fm), the vibration is better offset as the ratio M:R of M to the lead ratio R shown in the expression (1) comes closer to 1. Particularly, to acquire effectively high offset degree, it is desirable that the ratio of M:R is in a range of 0.95 to 1.05. In the description of the first embodiment, the ball screw 61*a* on the load side and the ball screw 61*b* on the reaction absorption side are rotated in the same direction. However, they may also be rotated in reverse directions.

According to the first embodiment of the present invention, reverse vibration against vibration caused by the load unit is generated by the reaction absorbing unit and the vibration in operation can be reduced or offset.

According to the first embodiment of the present invention, mass as a counter is not required to be added and the reaction absorber can be made light and compact. As a result, the driving of the reaction absorber can be sped up.

Further, since the reaction absorber can be made light and compact, time until the vibration is reduced or offset can be reduced and cycle time can be sped up. Since the time until the vibration is reduced or offset is short, the bonding head can execute the next process after the vibration is offset without sacrificing the cycle time and therefore, the quality can be enhanced.

Figure 4:
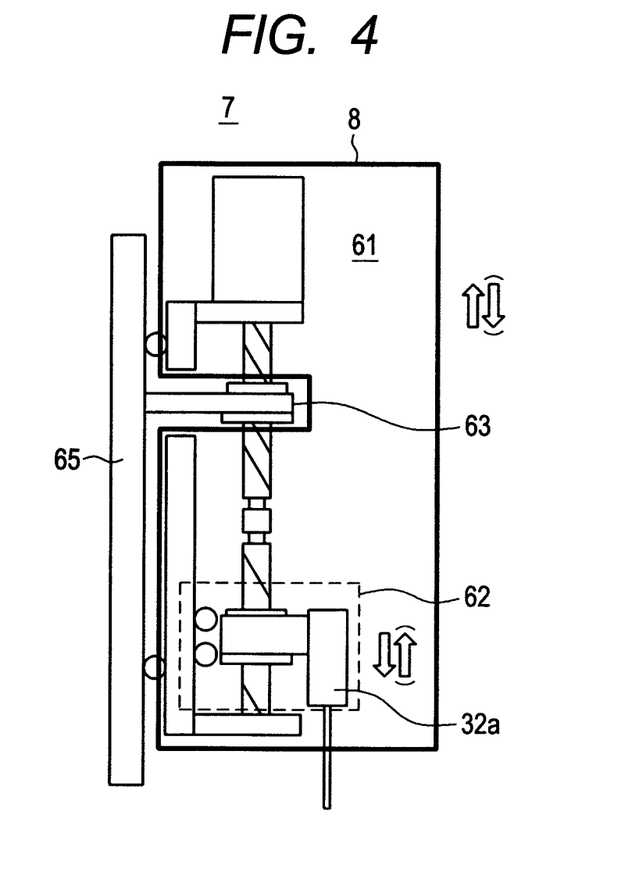
FIG. 4 shows the basic configuration of a Z-direction reaction absorber equivalent to a second embodiment of the present invention.

FIG. 4 shows the basic configuration of a Z-direction reaction absorber 7 equivalent to a second embodiment of the present invention. The Z-direction reaction absorber 7 is provided with a function for suctioning a die with a bonding head 32*a* and for raising/lowering the die for bonding. The basic configuration of the Z-direction reaction absorber 7 is basically the same as that in the first embodiment shown in FIG. 1. However, the Z-direction reaction absorber has some different points. The second embodiment will be described based upon the different points below. In FIG. 4, the same reference numeral is allocated to a part having the same function as the part in the first embodiment.

First, while the load in the first embodiment is the Z-direction reaction absorber 7 that raises/lowers the bonding head 32*a* shown in FIG. 4, a load in the second embodiment is the bonding head that raises/lowers an end of the Z-direction reaction absorber.

Accordingly, secondly, in the Z-direction reaction absorber 7, a load unit 62 provided with the bonding head is provided on the side of a pointed end and a reaction absorbing unit 63 is provided in the vicinity of a driving motor 61*c* at the base so as to facilitate raising/lowering the bonding head 32*a*, suctioning a die and bonding the die.

Thirdly, a unit base 65 of the Z-direction reaction absorber 7 is equivalent to the load fixing base 62*a* of the X-direction reaction absorber 6 or is fixed to the load fixing base 62*a*.

The rest of the configuration and the rest of operation are similar to those in the first embodiment. In FIG. 4, as in FIG. 2, the inside of a thick black line shows a counter mechanism 8 which functions as a counter load and which is provided with the driving unit 61 and the load unit 62, and the inside of a broken line shows the load unit 62.

In the second embodiment of the present invention, vibration in a reverse direction against vibration caused by the load unit is generated by the reaction absorbing unit and the vibration in operation can also be reduced or offset.

Since the counter mechanism 8 which functions as the counter load is also raised/lowered in the second embodiment, the load carrying capacity of the driving motor appears to be increased at a glance. In the related art, however, since a counter having the same mass is also required to be raised/lowered, the load carrying capacity of the motor is unchanged.

Further, also in the second embodiment of the present invention, mass as a counter is not required to be added and the reaction absorber can be made light and compact. As a result, the driving of the reaction absorber can be sped up.

Further, since the Z-direction reaction absorber can be made light and compact, the X-direction reaction absorber 6 described in the first embodiment can be made lighter and more compact and the whole bonding head device 32 can be made light and compact.

Furthermore, the throughput is enhanced because waiting time and low-speed driving time respectively in die bonding can be reduced by applying the direct acting bonding head device having degrees of freedom in two directions of the X direction and the Z direction described in the embodiments of the present invention to the die bonder 10 shown in FIG. 3. Further, since the vibration in die bonding can be reduced, the quality of a product, particularly die bonding precision, is enhanced.

Generally, in the die bonder, in addition to the bonding head device, a preforming head device directly acts with degrees of freedom in the two directions of the X direction and the Z direction and a wafer ring holder directly acts with degrees of freedom in two directions of the X direction and a Y direction. X, Y and Z are reference signs allocated to facilitate the understanding of the description and the reference numerals themselves have no meaning.

Accordingly, the throughput is enhanced because waiting time and low-speed driving time respectively in die bonding can be further reduced when the above-mentioned reaction absorber according to the present invention is also applied to the preforming head and the wafer ring holder. Further, since vibration in die bonding can be reduced, the quality of a product, particularly die bonding precision is further enhanced.

Figure 5:
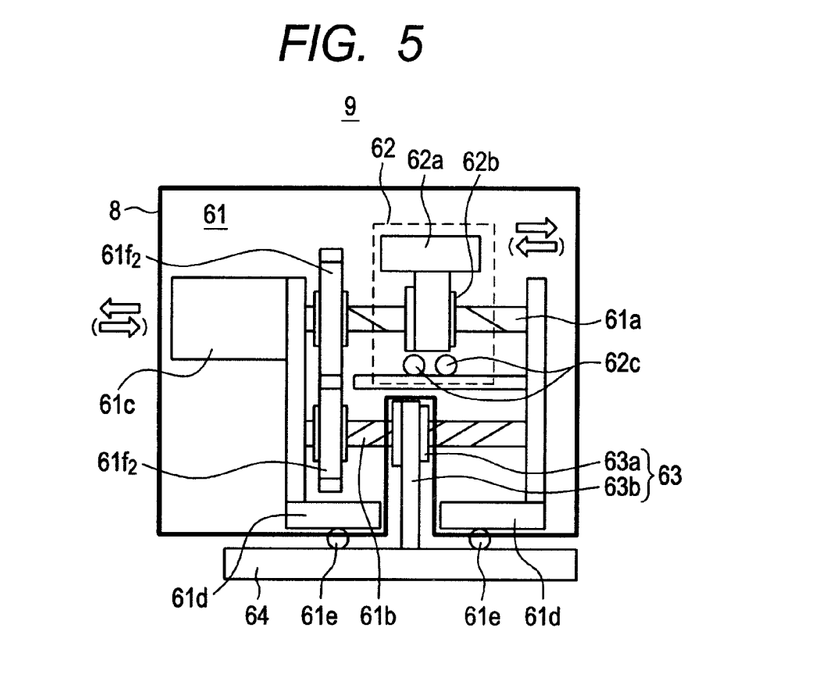
FIG. 5 shows the basic configuration of a reaction absorber equivalent to a third embodiment of the present invention.

FIG. 5 shows a reaction absorber 9 equivalent to a third embodiment which can be applied to the X-direction reaction absorber 6 and the Z-direction reaction absorber 7. The basic operation and the basic configuration in the third embodiment are the same as those of the first and second embodiments.

The third embodiment will be described in relation to points different from those in the first and second embodiments below.

In the third embodiment, a ball screw 61*a* on the load side and a ball screw 61*b* on the reaction absorption side are not aligned and are arranged in parallel. To drive both ball screws in parallel, the driving force of a driving motor 61*c* is transmitted to the ball screw 61*b* on the reaction absorption side via gears 61*f*1, 61*f*2. Since the driving force is transmitted via the gears, threads of the ball screw 61*a* on the load side and the ball screw 61*b* on the reaction absorption side are cut in reverse directions. As a result, a reaction absorbing unit 63 tries to move in the same direction as a load unit 62. However, since the reaction absorbing unit 63 is fixed to a unit base 64, the reaction absorbing unit is moved in a reverse direction to the load unit 62 based upon the unit base 64. As a result, a counter mechanism 8 shown inside a thick line is also moved in the reverse direction to the load unit 62 over the unit base 64 by a base guide 61*e*.

In FIG. 5, the driving force is transmitted via the gears. When the driving force is transmitted via a timing belt, the similar operation to the operation shown in FIG. 5 is acquired by cutting the threads in the same direction.

Accordingly, in the third embodiment, vibration in a reverse direction against vibration caused by the load unit 62 is also generated by the reaction absorbing unit 63 by making the counter mechanism 8 function as a counter load and the vibration in the operation can be reduced or offset.

Further, also in the third embodiment, since a new counter is not required to be provided, a reaction absorber can be made light and compact. As a result, the driving of the reaction absorber can be sped up.

Further, in the third embodiment, the load unit 62 and the reaction absorbing unit 63 are arranged vertically in the drawing based upon the unit base 64. As a result, the length of the movement of the reaction absorbing unit can be reduced. The arrangement is not limited to that shown in FIG. 5 and for example, the load unit 62 and the reaction absorbing unit 63 may also be arranged in a direction of the depth of the drawing over the unit base 64.

The die bonder has been described as an example of the semiconductor assembling system. However, the present invention can also be applied to another semiconductor assembling system in which a processing head is operated at high speed.

Figure 6:
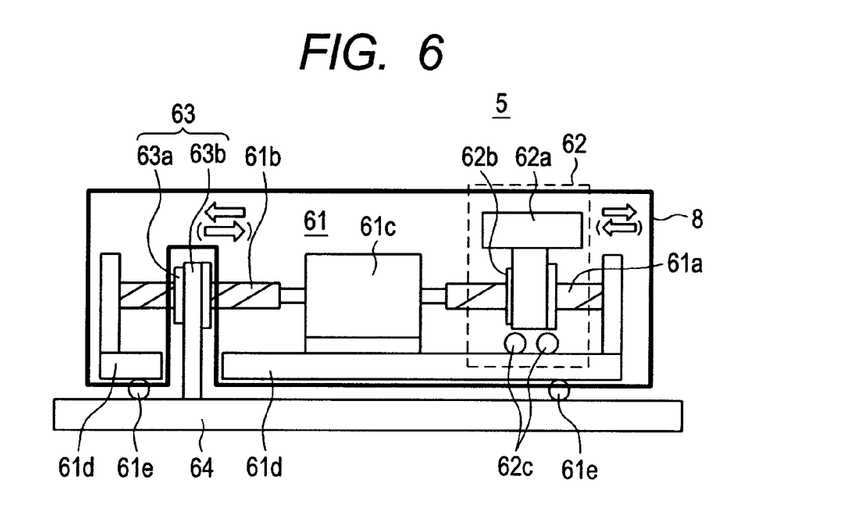
FIG. 6 shows the basic configuration of a reaction absorber equivalent to a fourth embodiment of the present invention.

FIG. 6 shows a reaction absorber 5 equivalent to a fourth embodiment. In the fourth embodiment, a ball screw 61*b* on the reaction absorption side is arranged on the left side of a driving motor 61*c* and a ball screw 61*a* on the load side is arranged on the right side of the driving motor 61*c*. At this time, the driving motor 61*c*, the ball screw 61*a* on the load side and the ball screw 61*b* on the reaction absorption side are aligned to make each rotational center of the motor 61*c*, the ball screw 61*a* on the load side and the ball screw 61*b* on the reaction absorption side matched. Each one end of the ball screw 61*a* on the load side and the ball screw 61*b* on the reaction absorption side is rotatably supported by a driving fixed plate 61*d*.

In the fourth embodiment, the basic operation is the same as that in the first and second embodiments.

The embodiments of the present invention have been described. The present invention includes various alternative examples, modification or transformation in a range not deviating from its object.

What is claimed is:

1. A semiconductor assembling system, comprising:
   a reaction absorber, comprising:
      a unit base;
      a support fixed to the unit base;
      a power source movable relative to the unit base;
      a load unit that is moved by the power source;
      a counter mechanism that includes the power source and the load unit, the mass of the counter mechanism being movable in a reverse direction with respect to the mass of the load unit by the power source; and
      a supporting member that is provided to the support and movably supports the counter mechanism; and
   a processing head that assembles a semiconductor provided to the load unit of the reaction absorber;
   wherein the semiconductor is assembled by the processing head.

2. The semiconductor assembling system according to claim 1,
   wherein the load unit is moved via a first ball screw by the operation of the power source; and
   the counter mechanism is movably supported via a second ball screw by the support.

3. The semiconductor assembling system according to claim 2, wherein the first ball screw and the second ball screw are aligned and are provided with a lead screw a thread of which is cut in the same direction.

4. The semiconductor assembling system according to claim 1,
   wherein the semiconductor assembling system is a die bonder; and
   the reaction absorber is applied to at least one direct acting unit out of a bonding head, a preforming head and a wafer ring holder respectively with which the die bonder is provided.

5. The semiconductor assembling system according to claim 4, wherein the direct acting unit is provided with two degrees of freedom mutually perpendicular.

6. The semiconductor assembling system according to claim 1, wherein the power source comprises a driving motor.

7. A semiconductor assembling system, comprising:
   a reaction absorber, comprising:
      a unit base;
      a support fixed to the unit base;
      a counter mechanism provided with a first ball screw, a load unit moved in a predetermined direction by the first ball screw, a second ball screw that generates reactive force in a reverse direction to the predetermined direction and a driving unit equipped with a power source that drives the first ball screw and the second ball screw, wherein the power source is movable relative to the unit base;
      a supporting member that is provided to the support and supports the counter mechanism movably by the second ball screw; and
      a reaction absorbing unit having the support and supporting member,
      wherein the mass of the counter mechanism is movable in a reverse direction with respect to the mass of the load unit; and
   a processing head that assembles a semiconductor provided to the load unit of the reaction absorber;
   wherein the semiconductor is assembled by the processing head.

8. The semiconductor assembling system according to claim 3, wherein the power source directly or indirectly drives one end of one of the first ball screw and the second ball screw or respective one ends of the first ball screw and the second ball screw.

9. The semiconductor assembling system according to claim 7, wherein the first ball screw and the second ball screw are aligned and are provided with a lead screw a thread of which is cut in the same direction.

10. The semiconductor assembling system according to claim 7,
    wherein the unit base is fixed to prevent movement; and
    the counter mechanism is moved along the unit base.

11. The semiconductor assembling system according to claim 9, wherein the power source directly or indirectly drives one end of one of the first ball screw and the second ball screw or respective one ends of the first ball screw and the second ball screw.

12. The semiconductor assembling system according to claim 7, wherein the first ball screw and the second ball screw are arranged in parallel.

13. The semiconductor assembling system according to claim 7, wherein a lead of the first ball screw is larger than a lead of the second ball screw.

14. The semiconductor assembling system according to claim 7,
    wherein the semiconductor assembling system is a die bonder; and
    the reaction absorber is applied to at least one direct acting unit out of a bonding head, a preforming head and a wafer ring holder respectively with which the die bonder is provided.

15. The semiconductor assembling system according to claim 14, wherein the direct acting unit is provided with two degrees of freedom mutually perpendicular.

16. The semiconductor assembling system according to claim 7, wherein the power source comprises a driving motor.

* * * * *